United States Patent
Ghaemmaghami et al.

(10) Patent No.: US 6,387,206 B1
(45) Date of Patent: May 14, 2002

(54) METHOD AND SYSTEM FOR PLASTIC PACKAGE DECAPSULATION OF ELECTRONIC DEVICES

(75) Inventors: Ahmad Ghaemmaghami, Gilroy; Mehrdad Mahanpour, Union City, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/375,456

(22) Filed: Aug. 17, 1999

(51) Int. Cl.[7] ............................... B44C 1/22
(52) U.S. Cl. ........................... 156/345; 216/93
(58) Field of Search ............................ 156/345; 216/93

(56) References Cited

U.S. PATENT DOCUMENTS

| | | |
|---|---|---|
| 4,344,809 A | 8/1982 | Wensink |
| 4,344,969 A | 8/1982 | Youngquist et al. |
| 4,384,917 A | 5/1983 | Wensink |
| 4,718,535 A | 1/1988 | Wolff |
| 5,424,254 A | 6/1995 | Damiot |
| 5,443,675 A | 8/1995 | Wensink |
| 5,641,987 A | 6/1997 | Lee |
| 5,766,496 A | 6/1998 | Martin |
| 5,783,098 A | 7/1998 | Martin et al. |
| 5,792,305 A | 8/1998 | Winsemius et al. |
| 5,855,727 A | 1/1999 | Martin et al. |
| 5,861,662 A | 1/1999 | Candelore |
| 5,880,523 A | 3/1999 | Candelore |
| 5,891,257 A | 4/1999 | Stephanie et al. |
| 5,932,061 A | 8/1999 | Lam |

*Primary Examiner*—Gregory Mills
*Assistant Examiner*—Sylvia R MacArthur
(74) *Attorney, Agent, or Firm*—Sawyer Law Group LLP

(57) ABSTRACT

Aspects for a decapsulation system and technique are described. In a method aspect, a portable decapsulation system is provided beneath at least one integrated circuit device on a printed circuit board. Package decapsulation of the least one integrated circuit device occurs through acid blasting by the portable decapsulation system. The portable decapsulation system includes a beaker, fuming acid within the beaker, and a sealed fitting for the beaker and holding an electronic device being decapsulated. Capillaries within the sealed fitting through which the fuming acid is released acid blast the electronic device, and a waste tube coupled to the sealed fitting for removal of solid waste during the acid blast.

7 Claims, 3 Drawing Sheets

METHOD AND SYSTEM FOR PLASTIC PACKAGE DECAPSULATION OF ELECTRONIC DEVICES

FIELD OF THE INVENTION

The present invention relates to decapsulation of plastic packages of integrated circuit (IC) chips, and more particularly to a pumpless decapsulation system that supports in situ utilization.

BACKGROUND OF THE INVENTION

Plastic packaging has been used for electronic devices, including semiconductor chips, for many years. To provide the plastic packaging, typically, epoxy resin is molded around the chip, a central portion of a lead frame, and bonding wires or other connections between contact pads on the chip to inner lead fingers on the lead frame. Often, decapsulation of the package, i.e., safe and effective removal of the epoxy, is desired at least in part to allow for inspection, test, and repair of the chip and the wire bonds to the chip and inner lead fingers.

Commonly, concentrated acids, such as sulfuric acid and nitric acid, or other solvents for the resin have been employed. Problems in prior art decapsulators and methods include difficulty in controlling the desired amount of etching, in removing debris formed in the etching process, in preventing damage to the package, including interior metallization, and in providing for adequate safety.

A decapsulator sold by B&G Enterprises, Inc. of Soquel, Calif., namely a Model 250, includes an appropriate acid resistant gasket sealed on an etch head, within which the device to be decapsulated is placed. A safety cover closes automatically when the process is started, clamping the device in place. The gasket on the etch head allows the chamber to be sealed and pressurized with nitrogen to approximately two PSI (pounds per square inch). The etching is started when a metering pump moves etchant from a heat exchanger located in plate with a sinuous passage into a cavity formed by the gasket, the device, and the etch head. The acid remains in the chamber for a short period of time, where it reacts with or attacks the encapsulant material. After the etchant has been allowed to work, the pump is activated again and a fresh volume of acid is moved into the cavity. This process continues until the desired amount of device exposure is achieved. When the integrated circuit is exposed at the end of the etch cycle, the pump runs continuously to flush the cavity. After this rinsing period, the entire system is purged with nitrogen, blowing all waste materials into a waste bottle. At the end of the process, the safety cover opens automatically, and the device is removed for post-etch cleaning.

While such decapsulation units do perform the necessary package removal, the use of mechanical pumps in the decapsulators adds significantly to their cost and thus the cost of IC device testing, including costs for repair and maintenance of the pumps. Further, the need to remove the device from its board in order to allow decapsulation in the decapsulator unit incurs a risk of shorting out the circuit and/or other forms of damage to the device. Further it is desirable to decapsulate the integrated circuit while the circuit is on a mother board or system card to better understand the failure mode as a function of system environment.

Accordingly, what is needed is a method and system for decapsulating plastic packages more efficiently and with greater ease. The present invention addresses such a need.

SUMMARY OF THE INVENTION

The present invention provides aspects for a decapsulation system and technique. In the present invention, a portable decapsulation system is provided beneath at least one integrated circuit device on a printed circuit board. Package decapsulation of the least one integrated circuit device occurs through acid blasting by the portable decapsulation system. The portable decapsulation system includes a beaker, fuming acid within the beaker, and a sealed fitting for the beaker and holding an electronic device being decapsulated. Capillaries within the sealed fitting through which the fuming acid is released acid blast the electronic device, and a waste tube coupled to the sealed fitting allows for removal of solid waste during the acid blast.

Through the present invention, a more efficient device decapsulation technique is provided that enhances the safety and ease of board level decapsulation. The decapsulation of the present invention requires no mechanical pump, thus reducing the cost as well as providing the advantage of allowing portable use. These and other advantages of the aspects of the present invention will be more fully understood in conjunction with the following detailed description and accompanying drawings.

DETAILED DESCRIPTION

The present invention relates to plastic package decapsulation of IC devices. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
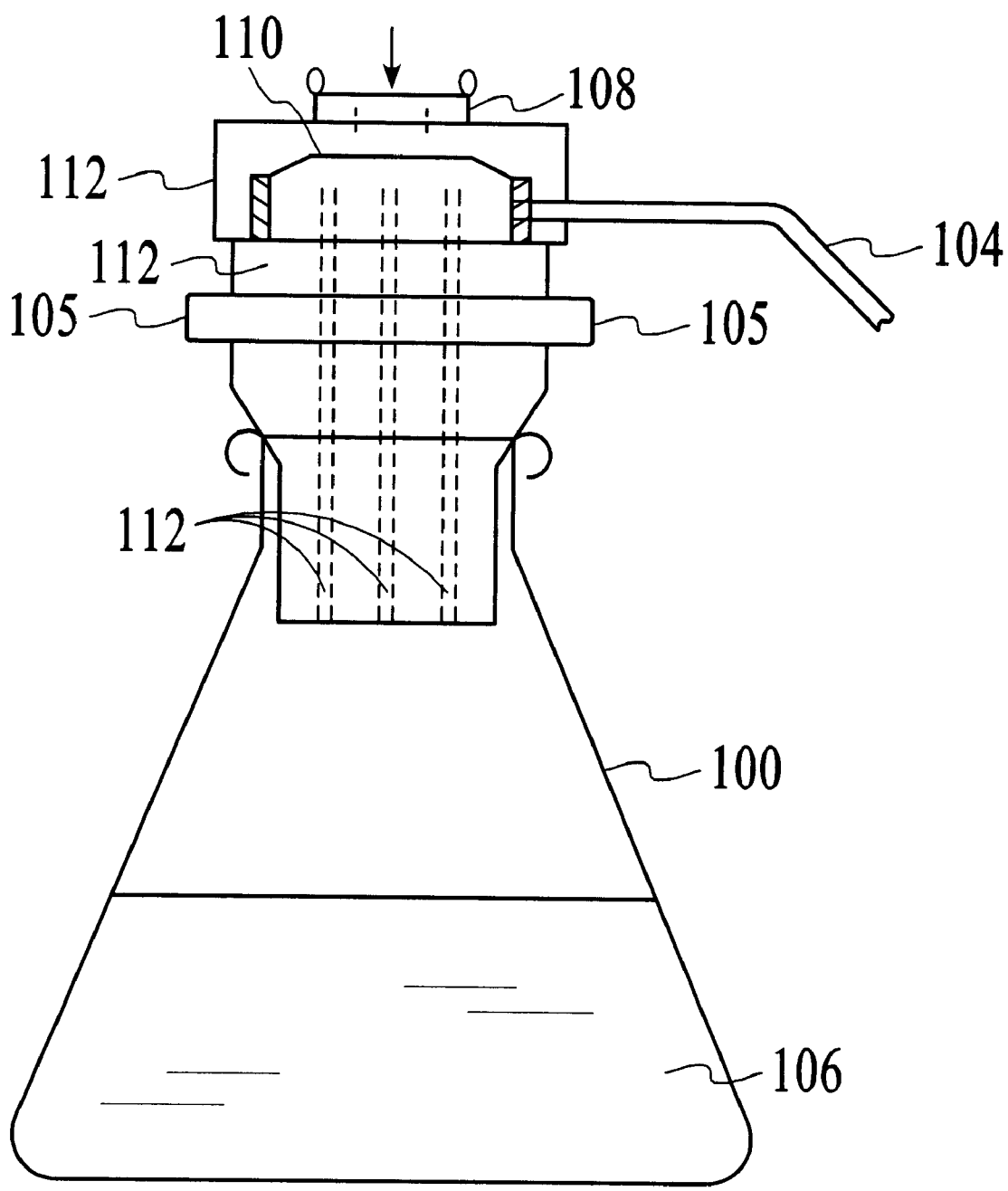
FIG. 1 illustrates a diagram of a decapsulation system in accordance with the present invention.
Figure 2:
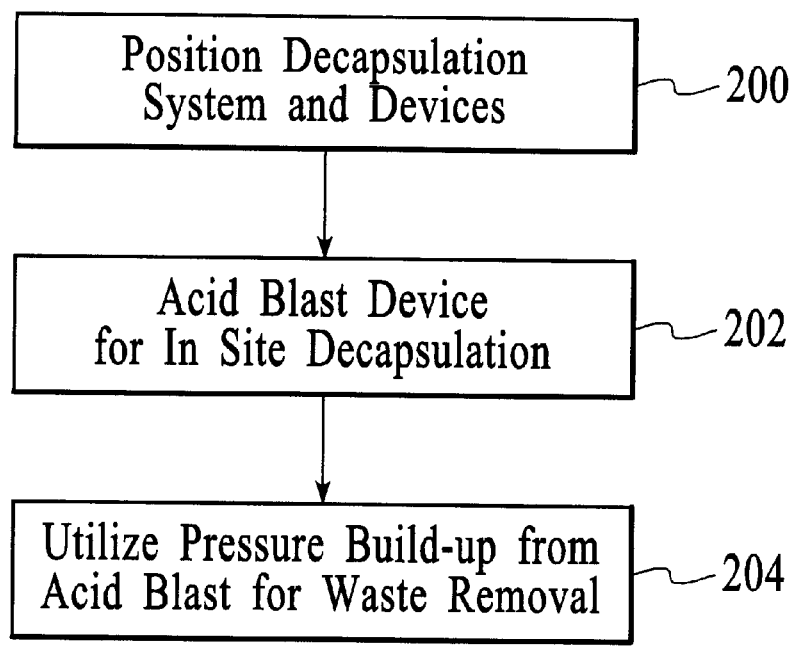
FIG. 2 illustrates a block flow diagram for decapsulation of an IC device with the system of FIG. 1.
Figure 3:
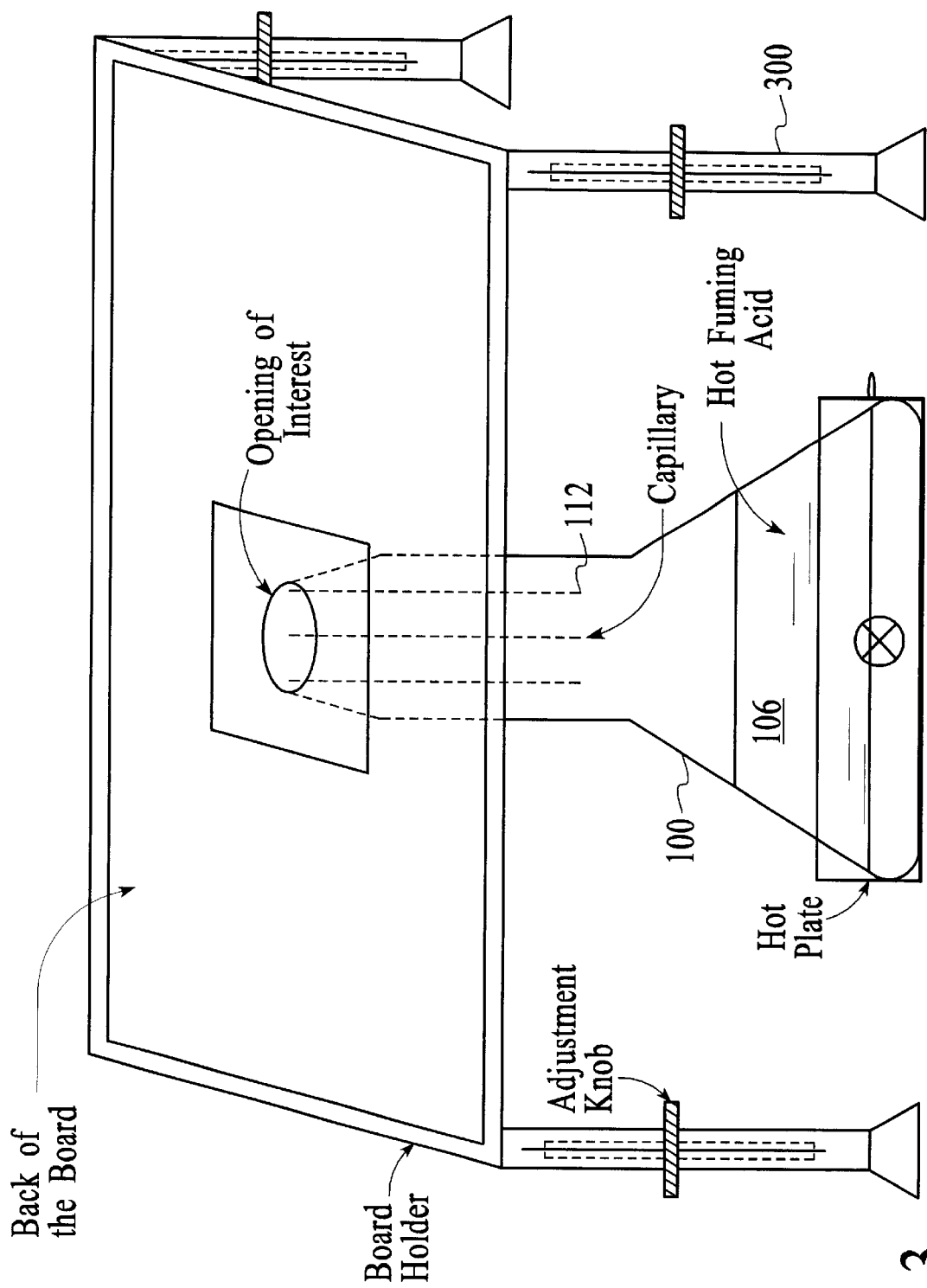
FIG. 3 illustrates use of the system of FIG. 1 in accordance with the present invention.

The present invention is described with reference to the system diagram of FIG. 1 in conjunction with the flow diagram of FIG. 2. As shown in FIG. 1, the system includes a beaker 100, a sealed fitting 102, and a waste tube 104. The sealed fitting 102 is held in place via a suitable secure holder 105. Within the beaker 100 is a chosen etching solvent solution, e.g., fuming nitric acid, 106. At least one device 108 is positioned over a cavity 110 of the sealed fitting 102 above small, tubular openings, i.e., capillaries, 112 in the sealed fitting 102 step 200). FIG. 3 illustrates use of the system of FIG. 1 in accordance with the present invention. As has been before mentioned, typically, on board decapsulation is accomplished by heating the entire board and dropping fuming nitric acid on the die of interest.

In contrast by utilizing a system in accordance with the present invention as illustrated in FIG. 3, the beaker 100 is placed directly underneath the PC board/ motherboard while securing and adjusting the board on the stand 300. The weight of the board provides for a better seal, thereby aiding in the decapsulation of the device. Preferably, the beaker 100 is formed of glass, while the sealed fitting is formed of TEFLON. A typical size for the beaker 100 is 500ml. Once positioned, the device 108 is then acid blasted for package decapsulation (step 202).

Figure 4:
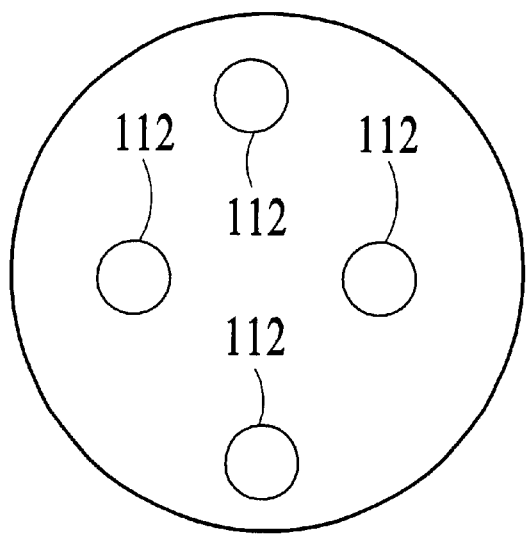
FIG. 4 illustrates a top view diagram of an arrangement of capillaries in a sealed fitting of the system of FIG. 1.

The acid blasting occurs by heating the beaker 100 of etching solvent solution, e.g., the fuming nitric acid, 106 to the etching solvent's boiling point. As a result, pressure builds up inside the beaker 100, and the solvent 106 is funneled through the to capillaries 112 to the surface of the plastic package of the device 108 that needs to be decapped. The capillaries 112 release the hot acid to the surface of the device 108 that has been mounted directly above the beaker 100 in the cavity 110. Since the pressure is released through the small capillaries 112, an acid blasting effect results that quickly performs the process of decapsulation. Preferably, the capillary diameter is between about $\frac{1}{32}$ and $\frac{1}{16}$ of an inch. FIG. 4 illustrates a top view of an exemplary arrangement of the capillaries 112. While the number of capillaries 112 needed is dependent upon the size of the chip surface, three to five capillaries in an arrangement corresponding to that of FIG. 4 are adequate for most devices.

The pressure build-up inside the beaker 100 during the acid blasting is also utilized for waste removal (step 204). With the pressure build-up, the solid waste produced during the acid blasting is guided away from the beaker through the waste tube 104 coupled to the sealed fitting 102 substantially adjacent to the cavity 110 within which the device 108 is positioned. The momentum of the boiling solvent through the capillaries 112 for the package etching and utilization of the corresponding pressure build-up for waste removal allow the decapsulation system of the present invention to avoid the use of a mechanical pump, as is used in the prior art, as well as to avoid the use of a typical patented vacuum system. Thus, the present invention is a less expensive and more portable decapsulator. Further, the portability allows direct use of the system with IC chips attached to a printed circuit board for in situ decapsulation.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A decapsulation system for removing plastic packaging from an electronic device, the decapsulation system comprising:

a beaker;

fuming acid within the beaker;

a sealed fitting for the beaker and holding an electronic device being decapsulated;

capillaries within the sealed fitting through which the fuming acid from the beaker is released to acid blast the electronic device; and waste tube coupled to the sealed fitting for removal of solid waste during the acid blast.

2. The decapsulation system of claim 1 wherein the fuming acid further comprises fuming nitric acid.

3. The decapsulation system of claim 1 wherein the beaker further comprises a glass beaker.

4. The decapsulation system of claim 1 wherein the sealed fitting further comprises a TEFLON sealed fitting.

5. The decapsulation system of claim 1 wherein the capillaries further comprise narrow tubular opening through the sealed fitting with a diameter of between about $\frac{1}{32}$ and $\frac{1}{16}$ of an inch.

6. The decapsulation system of claim 1, wherein the electronic device further comprises an integrated circuit chip attached to a printed circuit board.

7. A decapsulation system for removing plastic packaging from an electronic device, the decapsulation system comprising:

a beaker;

fuming acid within the beaker;

a sealed fitting for the beaker and holding an electronic device being decapsulated;

capillaries within the sealed fitting through which the fuming acid from the beaker is released to acid blast the electronic device without utilizing an external pressure source; and waste tube coupled to the sealed fitting for removal of solid waste during the acid blast.

\* \* \* \* \*